United States Patent
Norman et al.

(10) Patent No.: US 7,209,013 B2
(45) Date of Patent: Apr. 24, 2007

(54) SYSTEMS AND METHODS FOR SELF-CALIBRATION

(76) Inventors: Robert D Norman, 9135 Chickadee Way, Blaine, WA (US) 98230; Dominik J. Schmidt, 580 Arastradero Rd., Palo Alto, CA (US) 94306

( * ) Notice: Subject to any disclaimer, the term of this patent is extended or adjusted under 35 U.S.C. 154(b) by 0 days.

(21) Appl. No.: 11/359,187

(22) Filed: Feb. 22, 2006

(65) Prior Publication Data

US 2006/0194561 A1    Aug. 31, 2006

Related U.S. Application Data

(63) Continuation of application No. 11/011,990, filed on Dec. 14, 2004, now Pat. No. 7,023,286, which is a continuation of application No. 09/930,828, filed on Aug. 15, 2001, now Pat. No. 6,850,125.

(51) Int. Cl.
| | |
|---|---|
| G05D 23/20 | (2006.01) |
| H03B 5/04 | (2006.01) |
| H03L 1/00 | (2006.01) |
| H03L 1/02 | (2006.01) |
| H04L 27/00 | (2006.01) |

(52) U.S. Cl. ................ 331/65; 331/66; 331/70; 375/259; 455/73; 455/75

(58) Field of Classification Search ........... 331/65–66, 331/69–70, 175–176, 185–186; 375/259; 455/73, 75, 76
See application file for complete search history.

(56) References Cited

U.S. PATENT DOCUMENTS

| | | | |
|---|---|---|---|
| 5,081,431 A | 1/1992 | Kubo et al. ............... 331/158 |
| 5,379,230 A | 1/1995 | Morikawa et al. ........... 702/57 |
| 5,490,059 A | 2/1996 | Mahalingaiah et al. ...... 700/46 |
| 5,625,877 A | 4/1997 | Dunn et al. ................. 455/454 |
| 5,956,289 A | 9/1999 | Norman et al. ............ 365/233 |
| 5,960,354 A | 9/1999 | Einola ....................... 455/454 |
| 6,081,168 A | 6/2000 | Park ........................... 331/179 |
| 6,374,112 B1 | 4/2002 | Widegren et al. ........ 455/452.2 |
| 6,377,608 B1 | 4/2002 | Zyren ......................... 375/132 |
| 6,430,395 B2 | 8/2002 | Arazi et al. ................ 455/41.2 |
| 6,452,910 B1 | 9/2002 | Vij et al. .................... 370/310 |
| 6,509,788 B2 | 1/2003 | Naffziger et al. .......... 327/548 |
| 6,563,910 B2 | 5/2003 | Menard et al. ............... 379/45 |
| 6,600,726 B1 | 7/2003 | Nevo et al. ................. 370/278 |
| 6,745,018 B1 | 6/2004 | Zehavi et al. .............. 455/296 |
| 6,826,387 B1 | 11/2004 | Kammer .................... 455/41.2 |
| 6,850,125 B2 * | 2/2005 | Norman et al. .............. 331/65 |
| 2001/0010689 A1 | 8/2001 | Awater et al. .............. 370/344 |
| 2002/0028655 A1 | 3/2002 | Rosener et al. .............. 455/16 |
| 2002/0068570 A1 | 6/2002 | Abrol et al. ................ 455/438 |
| 2002/0128037 A1 | 9/2002 | Schmidt ................... 455/553.1 |
| 2003/0035388 A1 | 2/2003 | Schmidt .................... 370/329 |
| 2003/0058830 A1 | 3/2003 | Schmidt .................... 370/347 |

* cited by examiner

Primary Examiner—David Mis

(57) ABSTRACT

A self-calibrating integrated circuit includes a processor having at least one analog function used with the processor; one or more sensors adapted to sense one or more environmental parameters of the at least one analog function; and a solid state memory being configured to store the one or more environmental parameters of the at least one analog function.

20 Claims, 2 Drawing Sheets

| |
|---|
| IC is initialized (step 201) |
| Check for user adjustments (step 202) |
| Voltage, hot electron and temperature calibration signals are sent to the voltage generators, hot electron sources and heaters (step 203) |
| Hot electron sensor responses are monitored (step 204) |
| Hot electron sensor responses are averaged and the averaged result is compared to a predetermined range (step 206) |
| If the response is out of range, it is corrected in process (step 208) |
| Temperature sensors are monitored (step 210) |
| Temperature responses are averaged and the averaged result is compared to a predetermined range (step 216) |
| If the response is out of range, it is corrected (step 218) |
| Voltage sensors are monitored (step 220) |
| Voltage responses are averaged and the averaged result is compared to a predetermined range (step 226) |
| If the response is out of range, it is corrected (step 228) |
| Store environmental parameters in memory and repeat (step 240) |

FIG.2

SYSTEMS AND METHODS FOR SELF-CALIBRATION

This application is a continuation of U.S. patent application Ser. No. 11/011,990, now U.S. Pat. No. 7,023,286, filed Dec. 14, 2004 entitled "SYSTEMS AND METHODS FOR SELF-CALIBRATION," which is a continuation of U.S. patent application Ser. No. 09/930,828, now U.S. Pat. No. 6,850,125, filed Aug. 15, 2001, the contents of which are hereby incorporated by reference.

BACKGROUND

The present invention relates systems and methods for self-calibrating semiconductor devices.

Today's modern electronic products such as computers and high definition televisions rely on advanced integrated circuits (ICs) that operate at high speed. These products in turn rely on a clock source and clock signal that act as a master timing element for control of hardware.

Traditionally, a master clock source is generated off-chip and provided as an input to the ICs. One method for generating the clock signal uses crystals. While this method is well known and is reliable, off-chip generators take valuable circuit board space and have minimum height restrictions. A crystal-based system also requires extra pins for connecting the crystal to an integrated circuit requiring the clock signal. The crystal generator also requires external resistors and capacitors, adding cost, but more importantly takes more board space. Other disadvantages include an inability to operate over extended voltage ranges; long start times when power to the system is turned on; and high power consumption, making the systems less attractive in battery-powered applications.

On-chip oscillators have been designed for applications that demand low cost and low power consumption and applications that can't afford the space or pin requirement that crystal oscillators demand. For instance, ring oscillators have been used in IC designs where an exact clock signal is not required. Large performance variations, however, may be seen by the system as the ring oscillator frequency can vary over process differences, voltage variations and temperature excursions.

Yet another solution that designers have devised is to use of resistor-capacitor (RC) oscillator designs. RC oscillators lack the frequency accuracy of crystal oscillators, but are advantageous in that they can allow instant start-up of the clock signal from a stopped state. They also have low power consumption. However, when using analog electronic components such as those in the RC oscillator, it may be difficult to obtain precise voltages or measurements because analog components have many parameters that vary with process, temperature or power supply. For example, one or more reference voltages for an integrated circuit may be generated from a bandgap reference voltage circuit. If, however, the bandgap reference voltage is not accurate due to variations in power supply or temperature, then all reference voltages derived therefrom will also be inaccurate. This could induce substantial errors in the operation of the integrated circuit.

SUMMARY

In one aspect, a self-calibrating integrated circuit includes a processor having at least one analog function used with the processor; one or more sensors adapted to sense one or more environmental parameters of the at least one analog function; and a solid state memory being configured to store the one or more environmental parameters of the at least one analog function.

Implementations of the above aspect may include one or more of the following. One analog function can be provided by an oscillator. The one or more environmental parameters includes temperature or supply voltage. The one or more sensors include one or more temperature sensors, which can be diodes with metallization to screen out light. The one or more sensors include one or more hot-electron sensors, which can include deep well diodes. The one or more sensors include one or more hot electron generators such as ring oscillator-based hot electron generators. The one or more sensors include one or more heaters, which can include polysilicon resistors placed over a diode and transistors. The outputs of the sensors are provided to an analog switch. An analog to digital converter can be connected to the analog switch and to the processor to provide environmental data.

This type of A/D converter is typically included in mixed-signal systems already, so only a MUX is necessary for the autocalibrator. The A/D converter can be used at very low frequencies (since environmental factors like temperature do not change very fast) and it can be implemented with an inexpensive delta-sigma configuration.

Advantages of the invention may include one or more of the following. The system eliminates an external clock by using temperature compensated RC generator. The embedded FLASH memory holds self-calibration data. Each chip self calibrates during testing. Basically, the on-board ring oscillator is compared to a highly accurate crystal oscillator output during testing. The temperature is then varied using the on-chip polysilicon heater or a hot/cold chuck on the test system. Also, the voltage supply is varied to evaluate the impact of voltage on clock output. Additionally, the chip has temperature sensors at key locations across the chip. These sensors can be sensed using an on-chip A/D converter. The system minimizes wide variations in clock signal frequency over operating parameter variables such as voltage and temperature. The resulting ring oscillator is accurate for flash memory operation, requires less power, fewer pins and has fast start-stop gating. The system optimizes operating performance by dynamically monitoring environmental parameters and adjusting the operation and clock signal frequency. The system reduces cost by eliminating an external crystal clock. The system also frees up one or more pins that are normally dedicated to clock input signals. External precision components are not necessary since the FLASH memory calibrates the chip's mixed signal circuits to generate a precise, repeatable clock signal. The system maintains accurate clock signals over extended period since it has extensive self-test modes that allow it to self-calibrate.

The system achieves a low cost but sophisticated product which may be used in critical and precision applications that require calibration after manufacture of the individual functions of the system, and heretofore could only be implemented with more costly and space-consuming externally adjustable discrete components.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 2 shows an exemplary process for maintaining an oscillating frequency.

DESCRIPTION

Figure 1:
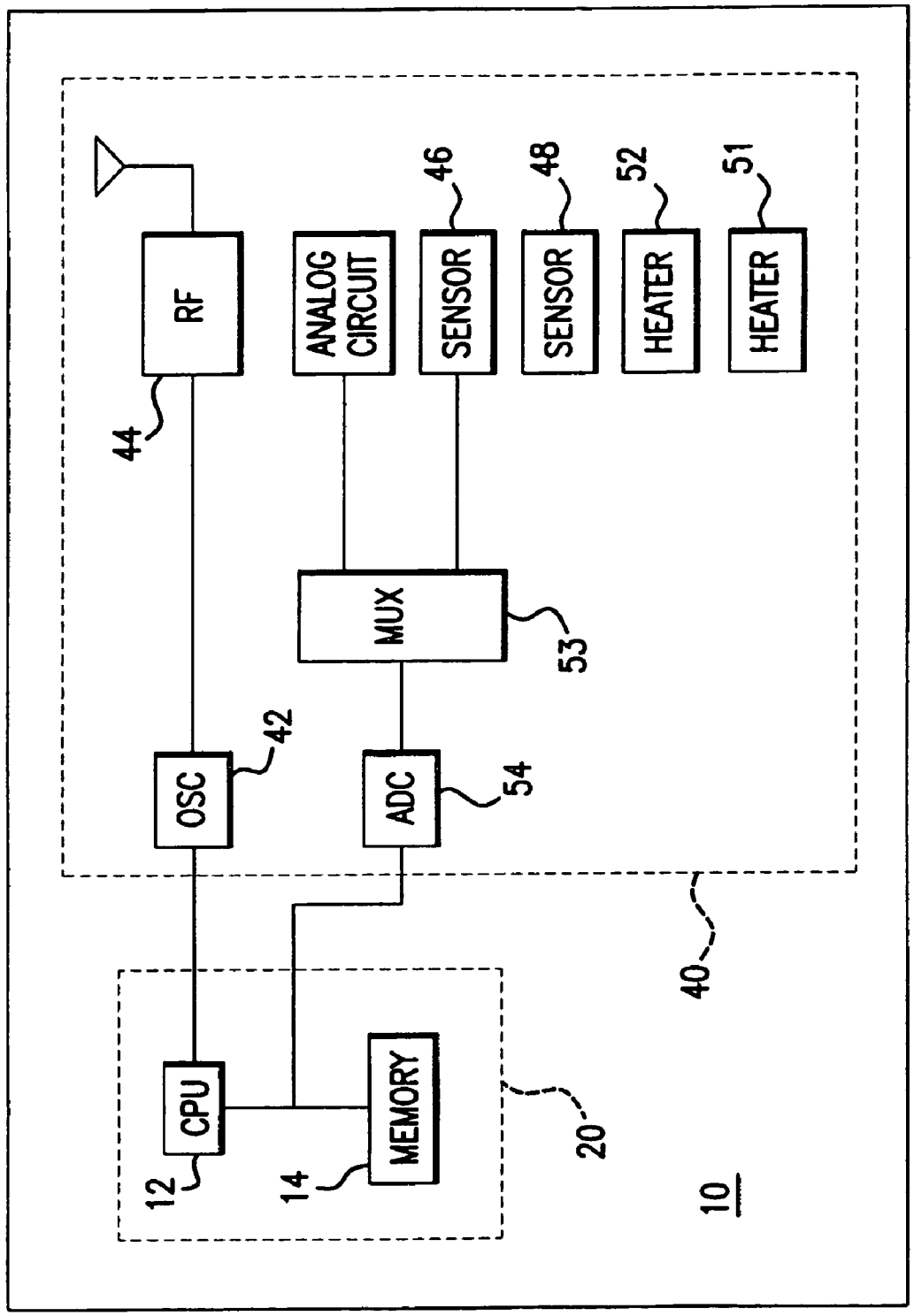
FIG. 1 shows an exemplary IC with self-calibration capability.

FIG. 1 shows an exemplary IC 10 with a digital portion 20 and an analog portion 40. The digital portion 20 includes a processor 12 and memory array 14, among others. The memory array 14 can be static random access memory (SRAM), dynamic random access memory (DRAM), and a FLASH memory, among others. The analog portion 40 also includes an on-chip clock oscillator 42 and one or more analog circuits 44 such as radio frequency (RF) transceivers or optical transceivers, for example.

The on-chip clock oscillator 42 can be a ring-oscillator or an RC oscillator or an LC oscillator. Typically, as known in the art, a ring oscillator includes a series of discrete components including transistors, capacitors, among others. For example, as discussed in U.S. Pat. No. 6,211,744 to Shin and U.S. Pat. No. 6,154,099 to Suzuki, et al., a conventional ring oscillator can be formed by connecting an odd number of inverters in a ring shape. In such a configuration, if Y is the state (signal level) at a connection point, the Y signal is inverted to Y by the next-stage inverter, and the Y is further inverted to Y by the second next-stage inverter. The signal level is sequentially inverted, and becomes Y at the connection point through one round because an odd number of inverters are connected. Through one more round, the signal level becomes the original Y. In this manner, the ring oscillator self-oscillates. An oscillation output is obtained from the output node of an arbitrary inverter.

Another conventional ring oscillator can use a NAND gate circuit for controlling start/stop of oscillation is inserted in a ring formed by connecting a plurality of even number of inverters. The start/stop of oscillation is controlled by externally inputting an "H"- or "L"-level control signal CNT to the NAND gate circuit. That is, the control signal CNT is first set at "L" level and then changed to "H" level to start oscillation. When the control signal CNT is at "L" level, an output signal from the NAND gate circuit is fixed at "H" level. Outputs from the odd-numbered inverters change to "L" level, outputs from the even-numbered inverters change to "H" level, and the initial states of the output levels of the respective inverters are determined. In this state, the ring oscillator does not oscillate. When the control signal CNT changes to "H" level, the NAND gate circuit substantially operates as an inverter, and the ring oscillator oscillates in the above manner where an odd number of inverters are connected in a ring shape.

The frequency of the oscillation signal from the conventional ring oscillator depends on the number of stages of inverters and a wiring delay. Hence, the lower oscillation frequency is obtained by increasing the number of stages of inverters and the length of the signal line. This increases the circuit size. Further, although the voltage-controlled oscillators have an identical circuit configuration, they have different oscillation frequencies due to certain factors of the production process. For example, the process can affect the gate delay time that can affect the precision of the oscillator.

The RC oscillator allows quicker oscillation time. A number of conventional RC oscillators can be used. For example, as discussed in U.S. Pat. No. 5,739,728, an RC oscillator has a capacitor C1, first and second resistors R1 and R2, a comparator COMP and a switch S1. When the voltage across the capacitor C1 is less than a bias voltage, the output of the comparator is at a logic low level and switch S1 is open. The capacitor is charged by current flowing through resistor R1 from a voltage source. When the voltage across the capacitor exceeds bias voltage, the output of the comparator switches to a high logic level which closes switch S1. The capacitor is then discharged through resistor R2. When the capacitor voltage drops back below the bias voltage, the comparator opens switch S1, thereby beginning a new cycle. As with the ring oscillator, the RC oscillator also faces frequency drift caused by process, temperature and voltage variations.

To capture information that allows the processor 12 to automatically calibrate the IC 10 so that the on-chip clock oscillator 42 is precise and accurate in spite of process, temperature or power supply variations, various sensors 46–48 are placed at predetermined locations in the IC 10 to sense environmental variations.

The analog portion 40 includes one or more temperature sensors 46, which can be diodes with metallization to screen out light. The output from the temperature sensors 46 are eventually digitized and provided to the processor 12 for adjusting the IC 10. To calibrate the temperature sensors 46, the analog portion 40 also has one or more heaters 52, which can be polysilicon resistors placed over a diode and transistors. The heaters 52 can also be used to bring the IC 10 to a predetermined temperature range if the IC 10 is below its normal operating temperature.

The analog portion 40 also includes one or more hot-electron sensors 48, which can be deep well diodes. The term hot-electron effect refers to the phenomenon of electrons which originate from FET surface channel currents, from impact ionization currents at the FET drain junction, or from substrate leakage currents. Electrons drifting from the gate may gain sufficient energy to enter into the gate, or they may collide with the silicon atoms and generate electron-hole pairs. The hole adds to substrate current, and the secondary electron may be injected into the gate of a subsequent FET. The deep well diodes sense the hot electron effect and provide this information eventually to the processor 12 to automatically compensate for hot electron effects. To provide calibration data for hot electron characterization of the IC 10, the analog portion 40 also includes one or more hot electron generators 50 such as small ring oscillators.

The outputs of the sensors 46–48 are provided to analog switch 53 that in turn is connected to a precision analog to digital converter 54 (ADC). The analog switch 53 is controlled by the processor 12 to select the output of one of the sensors 46–52 to the input of the ADC 54 to digitize autocalibration data. In one implementation, the ADC is a 12 bit ADC. The output of the ADC 54 is provided to the processor 12 to make decisions and the flash memory in the memory array 14 to store the autocalibration data.

The processor 12 can check the temperature at different locations on the IC 10 and average the temperature being sensed to better adjust to the actual temperature present. By monitoring the temperature of the IC 10, the processor 12 can detect whether the oscillator 42 is deviating from its specified frequency. In one embodiment, the flash memory has a parameter array with one element storing the operating temperature of the IC 10. The operating temperature information is used to generate differing delays based on circuit characteristics and based on temperature-induced shifts in oscillator frequency. The processor 12 adjusts the timing when the temperature changes outside the nominal setting by changing the number of the delay stages to compensate for the temperature range variations.

In addition to the temperature adjustments made by the controller, the system can also detect the supply voltage that the system is presently operating at and adjust for variations in the supply voltage. Like the temperature, the voltage represents an offset from the nominal voltage setting. If the operating voltage is not at a nominal value, the controller adjusts the ring oscillator delay path to compensate for the voltage differential. Environmental parameters of the IC 10 include temperature, supply voltage and other external parameters which effect the performance of the IC 10. Additional details on the device that corrects temperature and voltage variations are discussed in a co-pending patent application entitled "Ring Oscillator Dynamic Adjustments for Auto-calibration" and having Ser. No. 09/930,822, and now U.S. Pat. No. 6,853,259, filed Aug. 15, 2001, the content of which is hereby incorporated by reference.

An exemplary process of calibrating and correcting the IC 10 is shown in the flow chart 200 of FIG. 2. First, the IC 10 is initialized (step 201). The process 200 checks for user adjustments (step 202). If a user wants to adjust the operating frequency of the clock to meet the temperature and voltage conditions of the application, the process 200 adds the adjustments so that the oscillator moves toward the user specified operating frequency.

Next, in step 203, voltage, hot electron and temperature calibration signals are sent to the voltage generators, hot electron sources and heaters, respectively. These calibration signals are preferably generated by the processor 12 of FIG. 1 so that they have a known level and can be swept over a known test range. In process step 204, the hot electron sensor responses are monitored. In decision step 206, the hot electron sensor responses are averaged and the averaged result is compared to a predetermined range. If the response is out of range, it is corrected in process step 208. The above steps are performed for each sensor type. For example, in step 210, the temperature sensors are monitored. In decision step 216, the temperature responses are averaged and the averaged result is compared to a predetermined range. If the response is out of range, it is corrected in process step 218. Next, in step 220, the voltage sensors are monitored. In decision step 226, the voltage responses are averaged and the averaged result is compared to a predetermined range. If the response is out of range, it is corrected in process step 228. In the above manner, each sensor type is monitored and the environment sensed by the sensor type is adjusted. For example, if the temperature gets hotter (indicating slower silicon and slower ring oscillator) the flash system will move the oscillator settings to the faster settings to compensate for the slow down because of increased temperature or a corresponding decrease in operating voltage.

The data is continually collected. This is done by having the processor 12 instruct the switch 53 to connect to each sensor 46–52 in seriatim and the ADC 54 to digitize the environmental parameters, and the FLASH memory file to store the output of the ADC 54 (step 240). The FLASH memory file can store one sample point for each sensor, or can store historical data for the sensors.

To keep a constant clock frequency, the process 200 moves the oscillator as to the environmental changes. Moreover, the processor 12 can predict the environmental changes based on historical data.

Additionally, the process can calibrate sub-systems. For example, with respect to the wireless transceiver, responses that can be calibrated and corrected in with calibration signals from the processor 12 can include transmit/receive gain over temperature, transmit/receive gain over voltage, transmit/receive gain over hot electron effect, and frequency responses of the PLL's voltage-controlled oscillator and frequency steps of a phased-lock loop as function of voltage, temperature and hot electron level, for example. This process of calibration and correction can be conducted for each sub-system of the IC 10.

The term "FLASH memory" is used above to generally describe any non-volatile technology. The present invention applies to all non-volatile floating gate technologies such as EEPROM and FLASH memory. Additionally, RAM storage where the contents of the RAM are maintained for an extended period (more than 1 year) by an external battery source would also be within the scope contemplated by the present invention as well as any method of memory that is erasable and electrically programmable.

Moreover, although a self-calibrated clock has been discussed above, other self-calibrated functions are contemplated and within the scope of the invention. These functions include: analog-to-digital converter, digital-to-analog converter, voltage reference, current reference, timer, amplifier having a calibrated frequency response (high or low pass filter), offset voltage adjustment, bandpass filter (frequency detection), television or radio tuner, temperature transducer amplifier (linear and non-linear temperature profiles), pressure transducer amplifier, analog multiplier and divider, among others.

Although specific embodiments of the present invention have been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

The invention claimed is:

1. An integrated circuit, comprising:
   a digital portion including a processor;
   an analog portion including a radio frequency circuit configured to communicate radio frequency data;
   a plurality of sensors configured to sense environmental parameters;
   a memory configured to store self-calibration data; and
   wherein the processor is configured to adjust a portion of the integrated circuit based on the sensed environmental parameters.

2. The integrated circuit of claim 1, further comprising a multiplexer configured to provide an output of the plurality of sensors to the processor.

3. The integrated circuit of claim 2, further comprising an analog-to-digital converter coupled between the multiplexer and the processor.

4. The integrated circuit of claim 3, further comprising an oscillator coupled to the radio frequency circuit.

5. The integrated circuit of claim 4, wherein the processor is configured to adjust the oscillator based on the sensed environmental parameters.

6. The integrated circuit of claim 1, wherein the environmental parameters include at least one of temperature and supply voltage.

7. The integrated circuit of claim 1, wherein the plurality of sensors includes one or more hot-electron sensors.

8. The integrated circuit of claim 1, further comprising one or more hot-electron generators.

9. A method comprising:
   sensing at least one environmental parameter associated with a semiconductor device via at least one sensor on the semiconductor device, wherein the semiconductor device includes an analog portion including a radio frequency circuit configured to communicate radio frequency data and a digital portion; and controlling a clock frequency of the semiconductor device based on the sensed at least one environmental parameter.

10. The method of claim 9, further comprising comparing the sensed at least one environmental parameter to a predetermined value for the at least one environmental parameter stored in a memory.

11. The method of claim 9, further comprising adjusting the clock frequency using an oscillator of the semiconductor device.

12. The method of claim 9, wherein sensing the at least one environmental parameter comprises sensing a hot-electron effect of the semiconductor device.

13. The method of claim 9, further comprising adjusting a temperature of the semiconductor device if a sensed temperature is below a predetermined value.

14. The method of claim 13, further comprising adjusting the temperature via one or more heaters of the semiconductor device.

15. A system comprising:
a processor;
a radio frequency circuit coupled to the processor;
an oscillator coupled to the processor and the radio frequency circuit, the oscillator having a frequency controllable by the processor based on analysis of one or more environmental parameters; and
a plurality of sensors configured to sense the one or more environmental parameters, wherein at least one of the sensors comprises a hot-electron sensor.

16. The system of claim 15, further comprising a memory configured to store information regarding the one or more environmental parameters.

17. The system of claim 15, wherein the processor is configured to send calibration signals to sources of the one or more environmental parameters.

18. The system of claim 17, wherein the processor is configured to average outputs of a subset of the plurality of sensors.

19. The system of claim 16, wherein the memory is configured to store self-calibration data for the oscillator, the self-calibration data obtained during testing.

20. The system of claim 15, wherein the processor is configured to predict changes to the one or more environmental parameters based on historical data.

* * * * *

UNITED STATES PATENT AND TRADEMARK OFFICE
CERTIFICATE OF CORRECTION

| | | |
|---|---|---|
| PATENT NO. | : 7,209,013 B2 | Page 1 of 1 |
| APPLICATION NO. | : 11/359187 | |
| DATED | : April 24, 2007 | |
| INVENTOR(S) | : Robert D Norman et al. | |

It is certified that error appears in the above-identified patent and that said Letters Patent is hereby corrected as shown below:

Title Page ( * )   please delete "Notice: Subject to any disclaimer, the term of this patent is extended or adjusted under 35 U.S.C. 154(b) by 0 days." and substitute -- Notice: Subject to any disclaimer, the term of this patent is extended or adjusted under 35 U.S.C. 154(b) by 0 days. This patent is subject to a terminal disclaimer. --

Signed and Sealed this
Fourth Day of October, 2011

David J. Kappos
*Director of the United States Patent and Trademark Office*